United States Patent
Kohno et al.

[11] Patent Number: 5,250,453
[45] Date of Patent: Oct. 5, 1993

[54] PRODUCTION METHOD OF A SEMICONDUCTOR DEVICE

[75] Inventors: Yasutaka Kohno; Tomoki Oku, both of Itami, Japan

[73] Assignee: Mitsubishi Denki Kabushiki Kaisha, Tokyo, Japan

[21] Appl. No.: 953,049

[22] Filed: Sep. 29, 1992

Related U.S. Application Data

[62] Division of Ser. No. 504,837, Apr. 5, 1990, Pat. No. 5,187,112.

[30] Foreign Application Priority Data

Apr. 12, 1989 [JP] Japan ................. 1-93579

[51] Int. Cl.⁵ ........................... H01L 21/265
[52] U.S. Cl. ........................... 437/41; 437/44; 437/912
[58] Field of Search ............... 437/41, 44, 912, 40

[56] References Cited

U.S. PATENT DOCUMENTS

| | | | |
|---|---|---|---|
| 4,358,340 | 11/1982 | Fu | 156/643 |
| 4,645,563 | 2/1987 | Terada | 156/643 |
| 4,782,031 | 11/1988 | Hagio et al. | 437/39 |
| 4,923,823 | 8/1990 | Kohno | 437/41 |
| 4,962,054 | 10/1990 | Shikata | 437/40 |
| 4,992,387 | 2/1991 | Tamura | 437/41 |
| 4,997,779 | 5/1991 | Kohno | 437/41 |
| 5,112,766 | 5/1992 | Fujii et al. | 437/40 |

FOREIGN PATENT DOCUMENTS

| | | |
|---|---|---|
| 0113059 | 7/1984 | European Pat. Off. . |
| 0152615 | 8/1985 | European Pat. Off. . |
| 0177129 | 4/1986 | European Pat. Off. . |
| 0337299 | 10/1989 | European Pat. Off. . |
| 62-33476 | 2/1987 | Japan . |
| 62-86869 | 4/1987 | Japan . |
| 62-86870 | 4/1987 | Japan . |
| 2-253632 | 10/1990 | Japan . |

OTHER PUBLICATIONS

Enoki et al, "Optimization of GaAs SAINT Structure for Ion-Iplanted MMIC", ED986-9, pp. 23-28.

*Primary Examiner*—Brian E. Hearn
*Assistant Examiner*—Linda J. Fleck
*Attorney, Agent, or Firm*—Leydig, Voit & Mayer

[57] ABSTRACT

A method for producing a field effect transistor includes depositing an insulating film on an active layer produced in a semiconductor substrate and removing a part of the insulating film, leaving a side wall substantially perpendicular to the substrate. A refractory metal is deposited on the surface of the semiconductor substrate and the insulating film. The refractory metal is removed except for a portion at the side wall of the insulating film to produce a gate electrode. A high dopant concentration region is ion implanted using the insulating film and refractory metal as a mask. The insulating film is removed and an intermediate dopant concentration region is ion implanted using the refractory metal as a mask. A source electrode is produced on the high dopant concentration region and a drain electrode is produced on the intermediate dopant concentration region. The invention may be used to produce asymmetrically doped drain and gate regions and an asymmetrically disposed gate electrode.

6 Claims, 6 Drawing Sheets

PRODUCTION METHOD OF A SEMICONDUCTOR DEVICE

This application is a division of application Ser. No. 07/504,837, filed Apr. 5, 1990, now U.S. Pat. No. 5,187,112.

FIELD OF THE INVENTION

The present invention relates to a method for producing a semiconductor device and, more particularly, to a method for producing a narrow gate and an offset gate of a refractory metal in a self-aligned gate GaAs field effect transistor.

BACKGROUND OF THE INVENTION

Figure 5A:
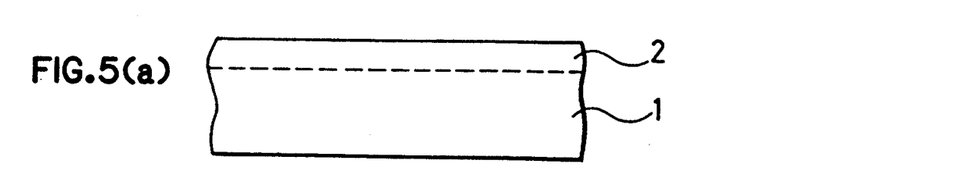
FIGS. 5(a) to 5(d) is a diagram showing major process steps of a prior art method for producing a semiconductor device.

FIGS. 5(a) to 5(d) show process steps in a prior art method for producing a semiconductor device. As shown in FIG. 5(a), an active layer 2 is produced at a desired position in a semi-insulating GaAs substrate 1 by ion implantation.

Figure 5B:
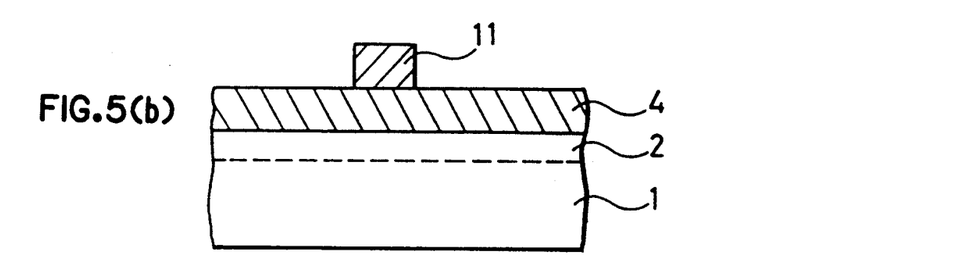
Figure 5C:
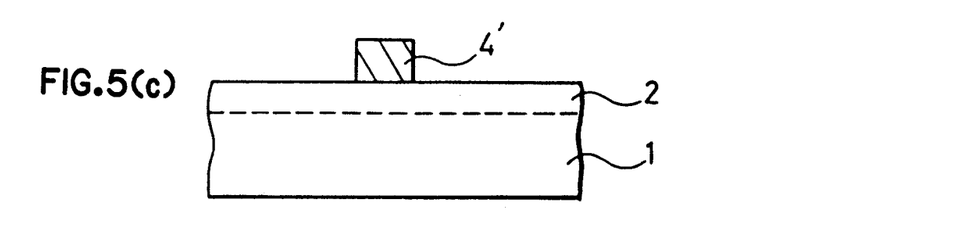
Figure 5D:
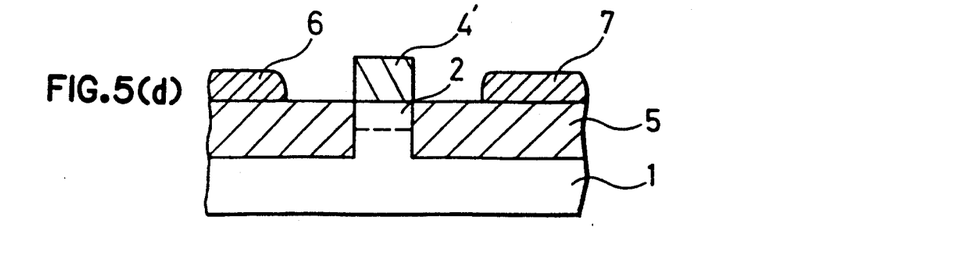

A refractory metal 4, such as tungsten silicide (hereinafter referred to as $WSi_x$), is deposited on the entire surface of the semi-insulating GaAs substrate 1 by sputtering or vapor deposition, and a pattern of photoresist 11 is formed where a gate is to be prepared, as shown in FIG. 5(b). As shown in FIG. 5(c), part of the $WSi_x$ 4 is removed by reactive ion etching using the photoresist 11 as a mask, thereby producing a gate electrode 4'. Finally, as shown in FIG. 5(d), ion implantation using the $WSi_x$ 4' as a mask produces high dopant concentration regions 5 (hereinafter referred to as an n+ region) after annealing, and a drain electrode 6 and a source electrode 7 are respectively produced thereon.

In the prior art method, in order to produce a gate electrode 4', patterning of the photoresist 11 is required. The precision of gate pattern depends on the precision of the photolithographic alignment technique. Furthermore, because the $WSi_x$ 4' is used as a mask for the ion implantation step, the n+ regions 5 below the source electrode 7 and the gate electrode 4' are close to each other, reducing the source resistance, advantageously increasing the gain of the FET. However, since the n+ regions 5 below the drain electrode 6 and the gate electrode 4' are close to each other, reducing the gate-drain breakdown voltage, this low gate-drain breakdown voltage makes it difficult to use this structure in high power analog ICs.

SUMMARY OF THE INVENTION

An object of the present invention is to provide a method for producing a semiconductor device with a narrow refractory metal gate without using photolithography, increased gate-drain breakdown voltage, and low source resistance.

Other objects and advantages of the present invention will become apparent from the detailed description given hereinafter; it should be understood, however, that the detailed description and specific embodiments are given by way of illustration only, since various changes and modifications within the spirit and scope of the invention will become apparent to those skilled in the art from this detailed description.

In a first method according to the present invention, an insulating film is produced on an active layer and a refractory metal is deposited on the entire surface of the semiconductor substrate. The refractory metal is partially removed but left at a side wall of the insulating film to produce a gate electrode. A high dopant impurity concentration region is produced by ion implantation using the insulating film and the refractory metal as a mask, the insulating film is removed, and an intermediate dopant impurity concentration region is produced by ion implantation using the refractory metal as a mask. A source electrode is produced on the high dopant impurity concentration region, and a drain electrode is produced on the intermediate dopant impurity concentration region.

In this method, since the refractory metal at the side wall of the insulating film is used as a gate electrode, a narrow refractory metal gate can be produced without being restricted in width by the precision of photolithography. Furthermore, since a high dopant impurity concentration region is produced beneath the source electrode and an intermediate dopant impurity concentration region is produced beneath the drain electrode, the gate-drain breakdown voltage is increased and the source resistance is reduced.

In another method according to the present invention, after the refractory metal is partially removed but left at the side wall of the insulating film, as in the first described method, and an intermediate dopant impurity concentration region is produced by ion implantation using the first insulating film and the refractory metal as masks, a second insulating film is deposited on the entire surface of the semiconductor substrate and is partially removed but left at a side wall of the refractory metal, the first insulating film is removed, moved, and a high dopant impurity concentration region is produced by ion implantation using the refractory metal and the second insulating film remaining at the side wall as masks. A drain electrode is produced at the side of the refractory metal gate electrode where the intermediate dopant impurity concentration region is produced, and a source electrode is produced on the opposite side of the refractory metal gate electrode.

In still another method according to the present invention, after the refractory metal is partially removed but left at the side wall of the insulating film in the first described method, the insulating film is removed, an intermediate dopant impurity concentration region is produced by ion implantation using the refractory metal which is to become a gate electrode as a mask, and a second insulating film is deposited on the entire surface of semiconductor substrate. Masks having asymmetrical configurations are produced at both side walls of the gate electrode, and a high dopant concentration region is produced by ion implantation using the second insulating film as a mask. A drain electrode is produced at the side of the refractory metal electrode where a wide intermediate dopant impurity concentration region has been produced, and a source electrode is produced on the opposite side of the gate electrode.

In yet another method according to the present invention, after the second insulating film is deposited on the entire surface of semiconductor substrate in the third described method, the second insulating film is partially removed but left at both side walls of the refractory metal in asymmetrical configurations, and a high dopant impurity concentration region is produced by ion implantation using the second insulating film remaining at both side walls and the refractory metal as masks. A drain electrode is produced at the side of the refractory metal electrode where a wider intermediate dopant impurity concentration region has been produced, and a source electrode is produced on the opposite side of the refractory metal gate electrode.

In these second, third, and fourth described methods, similar to the first described method, since the refractory metal remaining at the side wall of the insulating film is used as a gate electrode, a narrow refractory metal gate electrode is produced without being restricted in width by the precision of photolithography. Furthermore, the high dopant impurity concentration region below the source electrode is adjacent the gate electrode and the distance between the gate electrode and the high dopant impurity concentration region below the drain electrode is lengthened by producing an intermediate dopant impurity concentration region between the gate electrode and the high dopant impurity concentration region, thereby increasing the gate-drain breakdown voltage while holding the source resistance at a low value. Furthermore, a narrow interval is provided between the gate electrode and the high dopant impurity concentration region below the source electrode by producing an intermediate dopant impurity concentration region that is narrower than the intermediate impurity dopant concentration region and is disposed between the gate electrode and the high dopant impurity concentration region below the drain electrode, thereby preventing current leakage between the gate electrode and the high dopant impurity concentration region below the source electrode.

DETAILED DESCRIPTION OF THE PREFERRED EMBODIMENTS

Figure 1A:
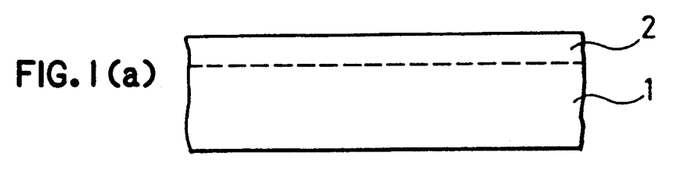
FIGS. 1(a) to 1(g) are cross-sectional views illustrating process steps of a method for producing a semiconductor device according to a first embodiment of the present invention.
Figure 1B:
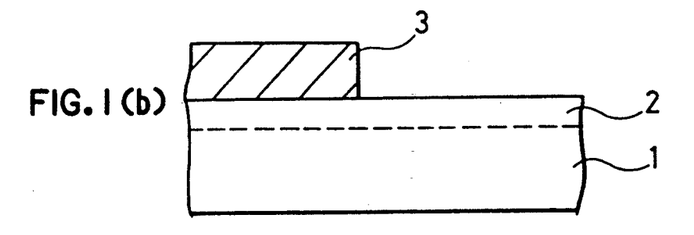

FIGS. 1(a) to 1(g) are cross-sectional views illustrating process steps for producing a semiconductor device according to a first embodiment of the present invention. First, as shown in FIG. 1(a), silicon ions are implanted in the semi-insulating GaAs substrate 1 at an energy of 50 KeV and a flux of $1.5 \times 10^{12}/cm^2$, thereby producing an active layer 2 that is 600 angstroms thick. A $SiO_2$ film 3 is deposited on the entire surface of the substrate to a thickness of about 3000 angstroms, and, thereafter, as shown in FIG. 1(b), the $SiO_2$ film 3 is patterned by reactive ion etching using a mixture of $CHF_3 + O_2$.

Figure 1C:
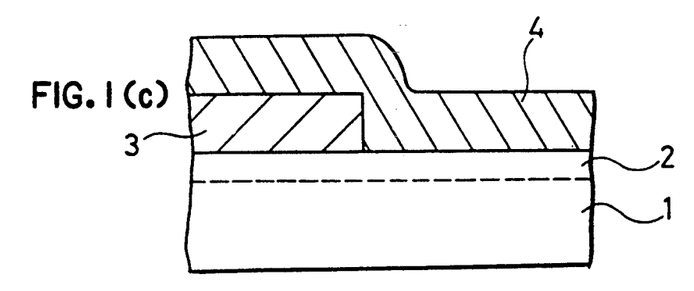

Next, as shown in FIG. 1(c), $WSi_x$ 4 is anisotropically etched by reactive ion etching using a mixture of $CHF_4 + O_2$, leaving a $WSi_x$ gate electrode 4' at the side wall of the $SiO_2$ film 3. In this case, the width of the $WSi_x$ gate electrode 4', that is, the gate length, has an upper limit of about 0.2 microns. The gate length is controlled by the thickness of the $WSi_x$ 4.

Figure 1D:
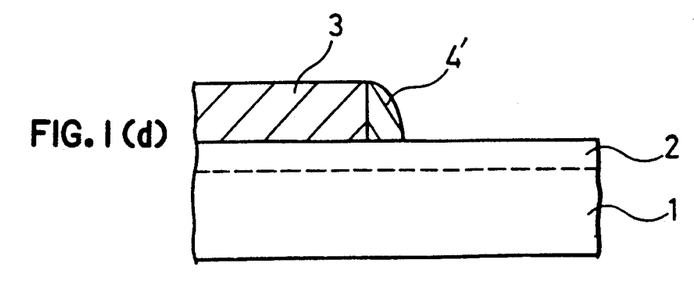
Figure 1E:
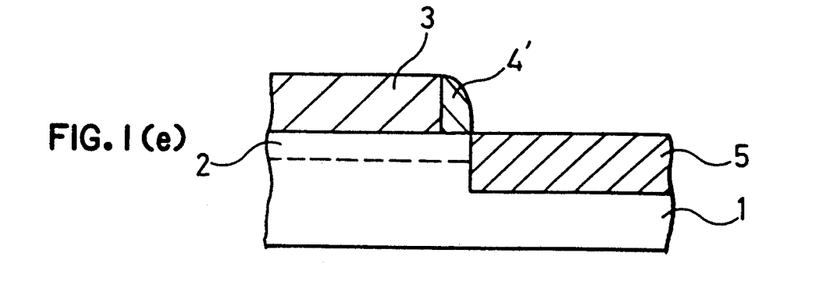

Next, as shown in FIG. 1(e), silicon ions are implanted at a flux of $3 \times 10^{13}/cm^2$ using the $SiO_2$ film 3 and $WSi_x$ gate electrode 4' as masks, thereby producing a high dopant impurity concentration n+ region 5 that is 1000 angstroms thick.

Figure 1F:
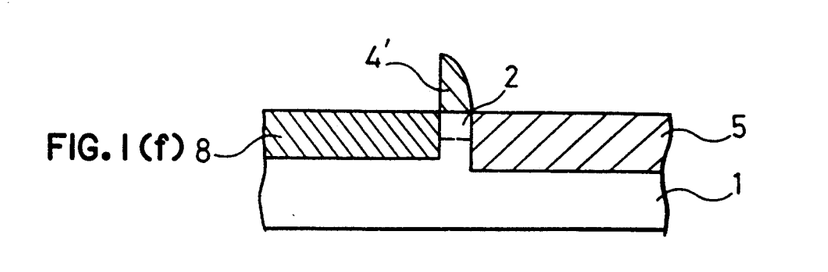

As shown in FIG. 1(f), the $SiO_2$ film 3 is removed using a hydrofluoric acid solution having a ratio of 1:30 of $HF:H_2O$, and silicon ions are implanted at a flux of $7 \times 10^{12}/cm^2$ using the gate electrode 4' as a mask, thereby producing an intermediate dopant impurity concentration n' region 8 that is 800 angstroms thick. In this case, silicon ions are also implanted into the n+ region 5, but the dopant impurity concentration of the n+ region 5 is quite high relative to the concentration of n' layer 8, thereby resulting in essentially no change in the dopant impurity concentration.

Figure 1G:
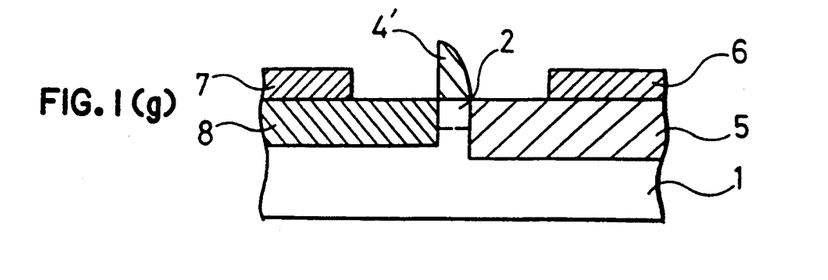

As shown in FIG. 1(g), after annealing at 800° C. for about 45 minutes, AuGe/Ni/Au is deposited and partially lifted off, thereby producing a source electrode 6 on the n+ region 5 and a drain electrode 7 on the n' region 8. Thus, a field effect transistor having a narrow gate is completed.

In this method, since the refractory metal remaining at the side wall of the insulating film after the etching is used as the gate electrode, a narrow refractory metal gate can be produced without being restricted in width by the precision of photolithography. Furthermore, since the dopant impurity concentration at the drain electrode side of the gate electrode is lower than at the source electrode side of the gate electrode and the depth of the drain region 8 is shallower than the depth of the source region 5, the gate-drain breakdown voltage is increased while the source resistance remains low.

FIGS. 2(a) to 2(e) are cross-sectional views illustrating process steps for producing a semiconductor device according to a second embodiment of the present invention. Beginning from the structure of FIG. 1(d), silicon ions are implanted at a flux of $7 \times 10^{12}/cm^2$ using the $SiO_2$ film 3 and $WSi_x$ gate electrode 4' as a mask, thereby producing an n' region 8. An $Si_3N_4$ film 9 is deposited on the entire surface of the semi-insulating GaAs substrate 1 in a chemical vapor deposition (CVD) process, thereby producing the structure of FIG. 2(a).

Figure 2A:
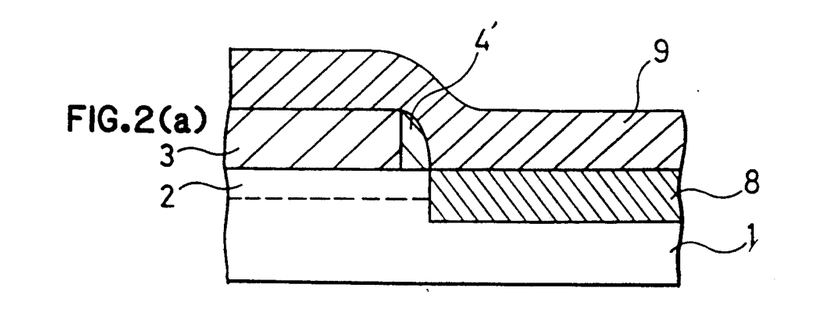
FIGS. 2(a) to 2(e) are cross-sectional views illustrating process steps of a method for producing a semiconductor device according to a second embodiment of the present invention.
Figure 2B:
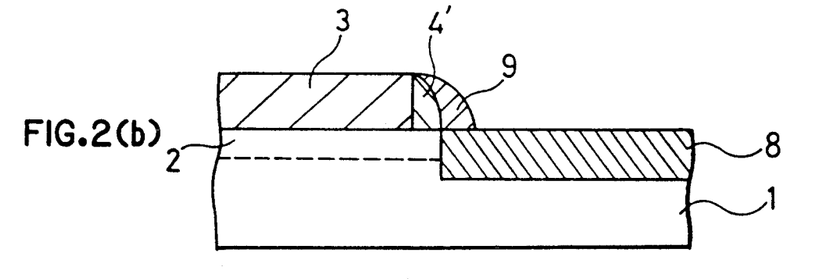

Next, as shown in FIG. 2(b), the $Si_3N_4$ film 9 is anisotropically etched by reactive ion etching, leaving a remaining portion of the $Si_3N_4$ film 9 at the side of the $WSi_x$ gate electrode 4'.

Figure 2C:
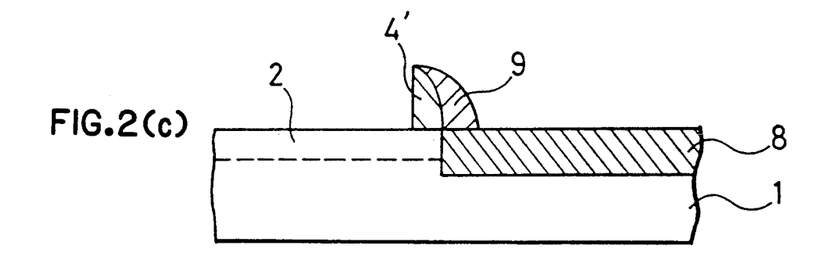

Next, as shown in FIG. 2(c), the $SiO_2$ film 3 is removed using a hydrofluoric acid solution having a ratio of 1:30 of $HF:H_2O$. In this case, since the etching rate of the remaining portion of the $Si_3N_4$ film 9 is less than 1/10 of the etching rate of the $SiO_2$ film 3, the remaining $Si_3N_4$ film 9 is hardly etched.

Figure 2D:
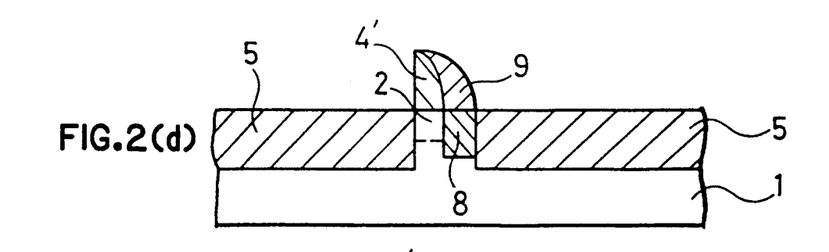

As shown in FIG. 2(d), silicon ions are implanted at a flux of $3 \times 10^{13}/cm^2$ using the $WSi_x$ gate electrode 4' and the remaining portion of the $Si_3N_4$ film 9 as a mask, thereby producing n+ regions 5 and leaving the part of the n' region 8 below the remaining portion of the $Si_3N_4$ film 9 in place.

Figure 2E:
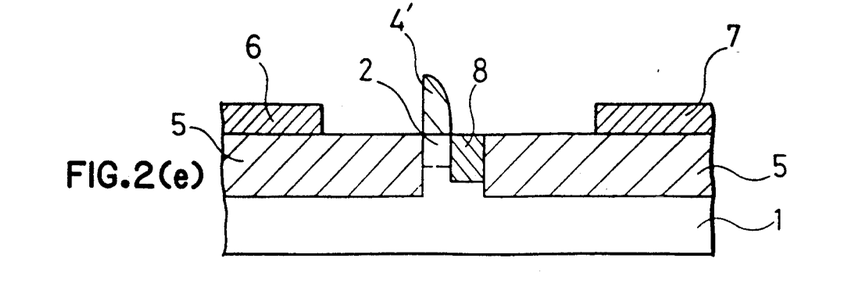

Next, as shown in FIG. 2(e), after annealing at 800° C. for about 45 minutes, the remaining portion of the $Si_3N_4$ film 9 is removed, and an AuGe/Ni/Au film is deposited and partially lifted off, thereby producing a drain electrode 7 on the n+ region 5 at the side of the gate electrode where the n' region 8 is left and a source electrode 6 is produced on the n+ region on the opposite side of the gate electrode 4', thereby completing a field effect transistor.

In this method, similar to the first embodiment, since the refractory metal remaining at the side wall of the insulating film 3 is used as the gate electrode, a narrow refractory metal gate electrode is produced without being restricted in width by the precision of photolithography. Furthermore, since the n+ region 5 below the source electrode 6 and the gate electrode 4' are close to each other and the n+ region 5 below the drain electrode 7 and the gate electrode 4' are spaced from each other by the remaining part of the n' region 8 between the n+ region and the gate electrode 4', the source resistance is reduced and the gate-drain breakdown voltage is increased.

Figure 3A:
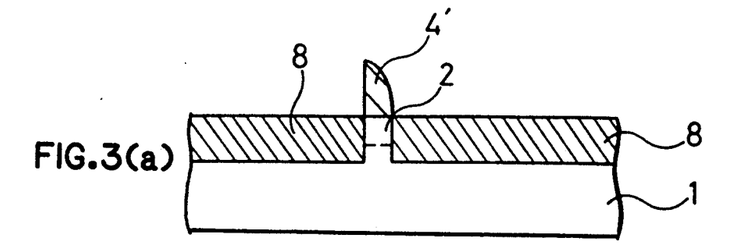
FIGS. 3(a) to 3(c) are cross-sectional views illustrating process steps of a method for producing a semiconductor device according to a third embodiment of the present invention.
Figure 3B:
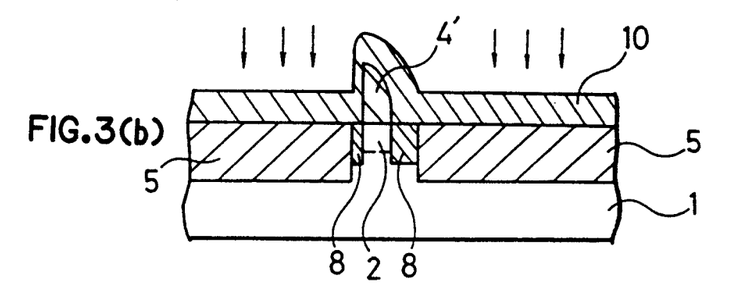
Figure 3C:
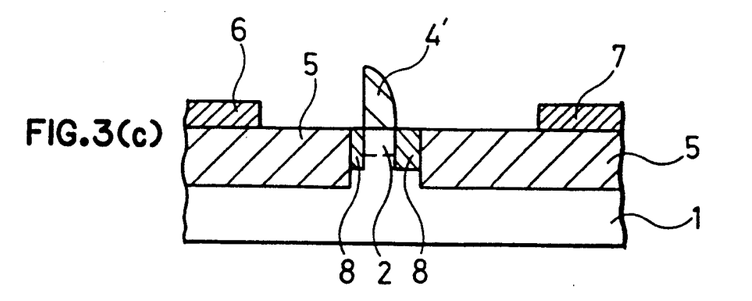

FIGS. 3(a) to 3(c) are cross-sectional side views illustrating process steps for producing a semiconductor device according to a third embodiment of the present invention.

Beginning from the structure of FIG. 1(d), the $SiO_2$ film 3 is removed using a hydrofluoric acid solution having a ratio of 1:30 of $HF:H_2O$, and, thereafter silicon ions are implanted at a flux of $3 \times 10^{13}/cm^2$ using the $WSi_x$ gate electrode 4' as a mask, thereby producing n' regions 8 as shown in FIG. 3(a).

As shown in FIG. 3(b), an $SiO_2$ film 10 is deposited on the entire surface of the semi-insulating GaAs substrate 1 to a thickness of about 2000 angstroms. In this case, since the configuration of the $WSi_x$ gate electrode 4' is asymmetrical, the $SiO_2$ film 10 is about 1000 angstroms thick at the side wall of the $WSi_x$ gate electrode 4' in FIG. 3(b) and about 2000 angstroms thick at the opposite, curved side wall of the $WSi_x$ gate electrode 4'. Therefore, the $SiO_2$ film 10 has an asymmetrical configuration at left and right sides of the $WSi_x$ gate electrode 4'. Accordingly, when n+ regions 5 are produced by implanting silicon ions at a flux of $3 \times 10^{13}/cm^2$ using the $SiO_2$ film 10 as a mask, the distances between the n+ regions 5 and the $WSi_x$ gate electrode 4' are also asymmetrical. Furthermore, the distances between the n+ regions 5 and the $WSi_x$ gate electrode 4' are controlled by the thicknesses of the $SiO_2$ film 10 at the sides of the gate electrode 4'. This process leaves residual portions of the n' regions 8 at both sides of the gate electrode 4'. The residual n' regions are asymmetrical because of the asymmetry of the $SiO_2$ film at the sides of the gate electrode 4'.

Next, after annealing, the $SiO_2$ film 10 is removed, and AuGe/Ni/Au is deposited and partially lifted off, thereby producing a drain electrode 7 on the n+ region 5 on the side of the gate electrode 4' where the wider n' region 8 remains and a source electrode 6 on the opposite side of the gate electrode 4'.

In this method, similar to the first and second embodiments, a narrow gate electrode is produced and a field effect transistor having a high gate-drain breakdown voltage is obtained while keeping the source resistance low. Since a narrow interval is provided between the gate electrode 4' and the n+ region 5 below the source electrode 6 by the n' region 8, which is narrower than the n' region 8 between the gate electrode 4' and the n+ region 5 below the drain electrode 7, leakage current flow between the gate electrode and the n+ region below the source electrode is prevented, and an improved efficiency field effect transistor is obtained.

Figure 4A:
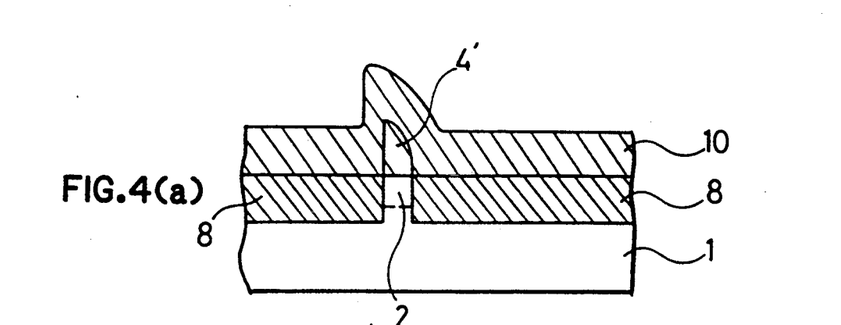
FIGS. 4(a) to 4(c) are cross-sectional views illustrating process steps of a method for producing a semiconductor device according to a fourth embodiment of the present invention.
Figure 4B:
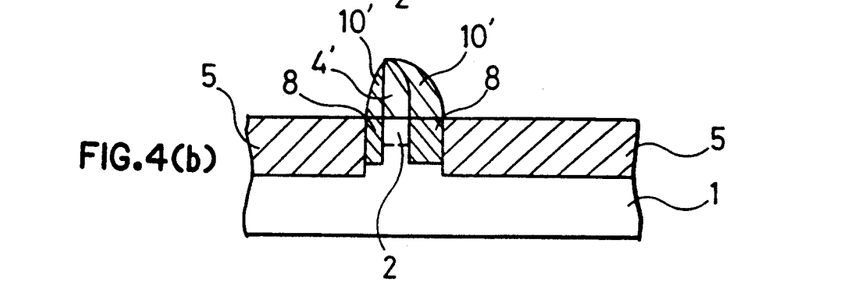
Figure 4C:
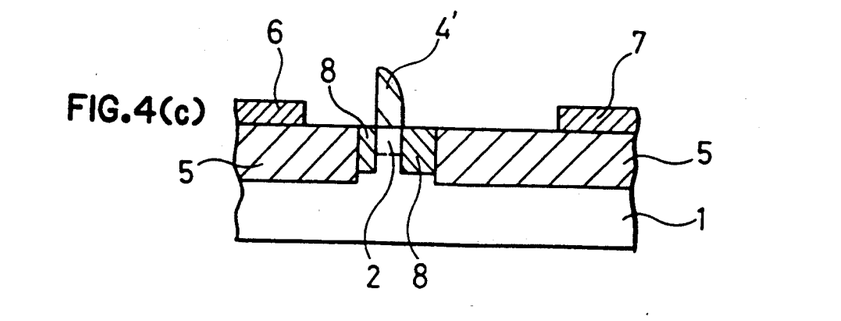

FIGS. 4(a) to 4(c) are cross-sectional side views illustrating process steps for producing a semiconductor device according to a fourth embodiment of the present invention.

Beginning from the structure of FIG. 3(a), an $SiO_2$ film 10 is deposited on the entire surface of the semi-insulating GaAs substrate 1 to a thickness of about 2000 angstroms, thereby resulting in the structure of FIG. 4(a). The $SiO_2$ film 10 is anisotropically etched by reactive ion etching using a mixture of $CHF_3$ to $O_2$, leaving portions of the film 10 at both sides of the $WSi_x$ gate electrode 4'. Since the $WSi_x$ gate electrode 4' has an asymmetrical configuration at the left and right sides of FIG. 4(b), the thicknesses of the $SiO_2$ films 10' remaining at the sides of $WSi_x$ gate electrode 4' are also asymmetrical. An $SiO_2$ film 10' about 1000 angstroms wide is produced at the vertical side wall of the $WSi_x$ gate electrode 4' and another film 10' about 2000 angstroms wide is produced at the curved side wall of the $WSi_x$ gate electrode 4'.

As shown in FIG. 4(b), silicon ions are implanted at a flux of $3 \times 10^{13}/cm^2$ using the $SiO_2$ films 10' at both sides of the $WSi_x$ gate electrode 4' as a mask, thereby producing n+ regions 5. In this case, the distances between the n+ regions and the $WSi_x$ gate electrode 4' are asymmetrical. Furthermore, the distances between the n+ regions 5 and the $WSi_x$ gate electrode 4' are controlled by the thicknesses of the $SiO_2$ films 10.

After annealing, the $SiO_2$ films 10' are removed and AuGe/Ni/Au is deposited and partially lifted off, thereby producing a drain electrode 7 on the n+ region 5 at the side of the gate electrode 4' where the wider n' region 8 remains and a source electrode 6 on the n+ region 5 at the opposite side of the gate electrode 4'.

In this method, similar to the first to third embodiments, since photolithography is not required for the production of the gate electrode, a narrow gate electrode is precisely produced. Furthermore, since a narrow interval is provided between the gate electrode 4' and the n+ region 5 below the source electrode, leakage current flow between the gate electrode 4' and the n+ region 5 is effectively prevented and the gate-drain breakdown voltage is increased while suppressing the source resistance.

In the first to fourth embodiments $WSi_x$ is used for the refractory metal of the gate electrode 4', WSiN or WN may also be used with the same effects as described above. In the second, third, and fourth embodiments the insulating films at the side walls of the gate electrode 4' are removed after the ion implantation, these films may be left in place with the same effects as described above.

As is evident from the foregoing description, according to the present invention, a refractory metal is deposited on the entire surface of a semiconductor substrate covering an insulating film deposited on an active layer in the semiconductor substrate. Thereafter, the refractory metal is removed, leaving a residual portion at the side wall of the insulating film, thereby producing a gate electrode. Accordingly, patterning by photolithography is not required to produce the gate electrode and the gate length is not restricted by the precision of photolithography, whereby a field effect transistor having a narrow gate is precisely and reproducibly made.

Furthermore, an n+ region having a high dopant impurity concentration is disposed below the source electrode and an n' region having a lower dopant impurity concentration is disposed below the drain electrode. In order to obtain an offset structure gate, the distance between the gate electrode and the n+ region below the drain electrode is lengthened by the insertion of an n' region between the gate electrode and the n+ region while maintaining a short distance between the gate electrode and the n+ region below the source electrode. Therefore, the source resistance is reduced and the gate-drain breakdown voltage is increased. Furthermore, since a narrow spacing is provided between the gate electrode and the n+ region below the source electrode by inserting an n' region having a narrower width than the n' region between the gate electrode and the n+ region below the drain electrode, leakage current flow between the gate electrode and the n+ region below the source electrode is prevented, and an improved efficiency field effect transistor is obtained.

What is claimed is:

1. A method for producing a semiconductor device comprising:

forming an active region in and at a surface of a semiconductor substrate;

depositing a first insulating film on said active region;

removing a portion of said first insulating film at the active region, leaving a side wall of said first insulating film substantially perpendicular to the surface of said substrate;

depositing a refractory metal material layer on the first insulating film and surface of said semiconductor substrate;

removing said refractory metal material except for a residual portion at the side wall of said first insulating film to produce a gate electrode;

producing an intermediate dopant concentration region in said semiconductor substrate by ion implantation using said first insulating film and said gate electrode as a mask;

depositing a second insulating film on the first insulating film, gate electrode, and surface of said substrate;

removing said second insulating film except for a residual portion at the gate electrode;

removing said first insulating film;

producing relatively high dopant concentration regions in said semiconductor substrate by ion implantation using said gate electrode and the residual portion of said second insulating film as a mask; and producing a drain electrode on the relatively high dopant concentration regions at a first side of the gate electrode where said intermediate dopant concentration region is disposed and producing a source electrode on the other of said relatively high dopant concentration regions opposite the first side of said gate electrode.

2. The method of claim 1 including controlling removal of refractory metal material to control the width of said residual refractory metal material portion remaining at said side wall of said first insulating film to equal a desired gate length.

3. The method of claim 1 including removing said refractory metal material by anisotropic etching.

4. The method of claim 1 including reactive ion etching said refractory metal material using a mixture of $CFH_3$ and $O_2$.

5. The method of claim 1 including implanting impurities in said relatively high dopant concentration region to a concentration of about $3 \times 10^{13}/cm^2$ and in said intermediate dopant concentration region to a concentration of about $7 \times 10^{12}/cm^2$.

6. The method of claim 1 including depositing one of $WSi_x$, WN, and WSiN as said refractory metal material.

* * * * *

UNITED STATES PATENT AND TRADEMARK OFFICE
CERTIFICATE OF CORRECTION

PATENT NO. : 5,250,453
DATED : October 5, 1993
INVENTOR(S) : Kohno et al It is certified that error appears in the above-identified patent and that said Letters Patent is hereby corrected as shown below:

Column 3, line 66, change "$CHF_4$" to --$CF_4$--;

Column 8, line 28, change "$CFH_3$" to --$CF_4$--.

Signed and Sealed this

Eighteenth Day of April, 1995

*Attest:*

BRUCE LEHMAN

*Commissioner of Patents and Trademarks*

*Attesting Officer*